United States Patent
Maier et al.

(10) Patent No.: US 7,572,344 B2
(45) Date of Patent: Aug. 11, 2009

(54) METHOD FOR THE PRODUCTION OF WEAR-RESISTANT SIDES FOR A KEYSTONE RING FOR INTERNAL COMBUSTION ENGINE

(75) Inventors: Kurt Maier, Leonberg (DE); Jose Manoel Martins Leites, Stuttgart (DE); Nuno Machado, Coimbra (PT)

(73) Assignee: Mahle GmbH, Stuttgart (DE)

( * ) Notice: Subject to any disclaimer, the term of this patent is extended or adjusted under 35 U.S.C. 154(b) by 370 days.

(21) Appl. No.: 11/629,142

(22) PCT Filed: Jun. 10, 2005

(86) PCT No.: PCT/DE2005/001044

§ 371 (c)(1),
(2), (4) Date: Mar. 9, 2007

(87) PCT Pub. No.: WO2005/121609

PCT Pub. Date: Dec. 22, 2005

(65) Prior Publication Data

US 2007/0252338 A1    Nov. 1, 2007

(30) Foreign Application Priority Data

Jun. 11, 2004   (DE) .................... 10 2004 028 487

(51) Int. Cl.
*F16J 9/26* (2006.01)
(52) U.S. Cl. ..................................... 148/217
(58) Field of Classification Search .................. 148/217
See application file for complete search history.

(56) References Cited

U.S. PATENT DOCUMENTS

| | | | |
|---|---|---|---|
| 3,814,447 A | 6/1974 | Prasse et al. | |
| 4,579,355 A | 4/1986 | Koorocki | |
| 5,713,129 A | 2/1998 | Rastegar et al. | |
| 6,149,162 A | 11/2000 | Tanaka et al. | |
| 6,698,763 B2 | 3/2004 | Ogawa et al. | |

FOREIGN PATENT DOCUMENTS

DE    35 06 746    9/1985

(Continued)

OTHER PUBLICATIONS

International Search Report.

*Primary Examiner*—Roy King
*Assistant Examiner*—Yoshitoshi Takeuchi
(74) *Attorney, Agent, or Firm*—Collard & Roe, P.C.

(57) ABSTRACT

A method for the production of wear-resistant edges for a keystone ring for internal combustion engines, involves forming a rectangular ring from a steel strip with a rectangular cross-section, grinding the ring edges and the outer circumferential faces to give the required profile and brushing the inner circumferential face, grinding the upper and lower ring edge to form the keystone ring, complete nitriding of the piston ring surface by a gas-nitriding process (GNS) to form a nitride layer, profiling the nitrided piston ring by grinding and lapping without machining the nitrided edges of the piston ring, stacking the piston rings on the parallel faces, coating the outer circumferential faces of the piston rings with a wearing layer, and grinding the nitrided layer of the faces in the stacked state such that at most a quarter of the total thickness of the nitrided layer is removed.

6 Claims, 2 Drawing Sheets

FOREIGN PATENT DOCUMENTS

| | | | | | |
|---|---|---|---|---|---|
| DE | 199 40 022 A1 | 3/2000 | EP | 0 605 223 A1 | 7/1994 |
| DE | 10207 148 | 9/2002 | GB | 2 153 965 A | 8/1985 |
| | | | JP | 05050241 A | 3/1993 |
| | | | JP | 05060241 A | 3/1993 |

METHOD FOR THE PRODUCTION OF WEAR-RESISTANT SIDES FOR A KEYSTONE RING FOR INTERNAL COMBUSTION ENGINE

CROSS REFERENCE TO RELATED APPLICATIONS

Applicants claim priority under 35 U.S.C. § 119 of German Application No. 10 2004 028 487.3 filed Jun. 11, 2004. Applicants also claim priority under 35 U.S.C. §365 of PCT/DE2005/001044 filed Jun. 10, 2005. The international application under PCT article 21 (2) was not published in English.

BACKGROUND OF THE INVENTION

The invention relates to a method for the production of wear-resistant sides for a keystone ring for internal combustion engines, in which a rectangular ring is first formed, consisting of a steel strip having a rectangular cross-section as the base material, having an inner and an outer circumference surface as well as an upper and a lower side, which ring is subsequently nitrided on all sides by means of a nitriding process, and subsequently brought into its final shape and geometry by means of machining of the surfaces, whereby the base material is exposed on the sides by means of the machining.

Piston rings having a trapezoid cross-section—ring width at the outer circumference surface greater than at the inner circumference surface—are preferably used in diesel engines as a top ring, whereby the related piston ring groove is also shaped as a trapezoid. Diesel engines tend towards deposits of hard residues that contain carbon, in the first—uppermost—piston ring groove, which can lead to seizing of the piston rings and therefore to functional failures. In general, seizing is prevented by means of the trapezoid configuration of the piston rings and the piston ring groove, and therefore the sealing function is guaranteed. In the production of rectangular rings for pistons of internal combustion engines, it is known to apply a nitride layer onto the entire surface of the ring, by means of a gas nitriding process, in order to harden the surface and thereby achieve better wear resistance. Such piston rings are described in DE 35 06 746 C2, EP 0 605 223 A1, or in JP 05060241 A, whereby the wear resistance of the working surface of the piston rings, in particular, is further increased by means of applying additional coatings, as is known from the aforementioned references and from DE 102 07 148 A1.

It is also known, in the production of keystone rings or double keystone rings, which are formed from rectangular rings, to subject the entire surface of the rings to a nitriding process. For forming or profile-shaping such a piston ring into a keystone ring, it is necessary to grind the sides accordingly, whereby the nitride layer is removed from the sides again, in whole or in part, depending on the geometrical requirements. Final profile-shaping takes place by means of further machining steps of the ring surfaces, with subsequent application of a wear protection coating of the working surface, as well as final machining. This production sequence is appropriately optimized with regard to the ability of the rings to be stacked, in other words simultaneous multiple machining in a package.

In engine operation, however, the keystone rings produced in this manner and inserted into steel pistons show that the ring sides increasingly demonstrate friction wear damage (fretting), particularly due to the high ignition pressures of 200 bar to 220 bar, whereby additional coking can also be found. This damage increases with an extension of the useful lifetime of the piston rings, and finally leads to failure. It has furthermore been shown that this damage occurs as a function of location, i.e. at different intensity on the ring sides, along the circumference.

SUMMARY OF THE INVENTION

It is the task of the invention to prevent the occurrence of side damage on keystone rings or double keystone rings, during engine operation, to a great extent.

According to the invention, this task is accomplished by a method for the production of wear-resistant sides for a keystone ring for internal combustion engines, in which a rectangular ring is first formed, and is subsequently nitrided on all sides by a nitridin process. The ring consists of a steel strip having a rectangular cross-section as the base material, an inner and an outer circumference surface as well as an upper and a lower side. The ring is subsequently brought into its final shape and geometry by means of machining of the surfaces, and the base material is exposed at the ring sides by means of the machining. The ring is shaped to form a piston ring having a rectangular cross-section by parallel grinding of the ring sides and grinding of the outer circumference surface to form its intended profile, and brushing of the inner circumference surface. The upper and lower ring side is ground to form the keystone ring, in such a manner that the piston ring still has parallel sides as a stacking surface in the region of its outer circumference surface. The piston ring surface is then completely nitrided by means of the gas nitriding process (GNS), to form a nitride layer. The nitrided piston ring is then shaped by means of grinding and lapping, without machining of the nitrided sides of the piston ring. The piston rings are stacked by way of their parallel sides, under axial bias, to form a package, and the outer circumference surface of the piston rings is coated with a wear-resistant layer by means of PVD method(s). The nitride layer of the sides in the de-stacked state is ground in such a manner that a maximum of one-fourth of the total layer thickness of the nitriding layer is removed.

By means of the production method according to the invention, wear-resistant ring sides are created, which demonstrate significantly reduced friction wear during engine operation, as compared with the state of the art. The method assures the production of uniformly high hardness values by means of the production of a nitride layer on the ring sides, having a uniform nitriding depth, so that no damage that can impair the ring function occurs on the ring sides any longer, along the circumference of the ring sides. Likewise, micro-bonding between the piston ring and the piston is effectively prevented.

BRIEF DESCRIPTION OF THE DRAWINGS

An exemplary embodiment of the invention will be described in the following, using the drawings, these show.

DETAILED DESCRIPTION OF THE PREFERRED EMBODIMENTS

Figure 1:
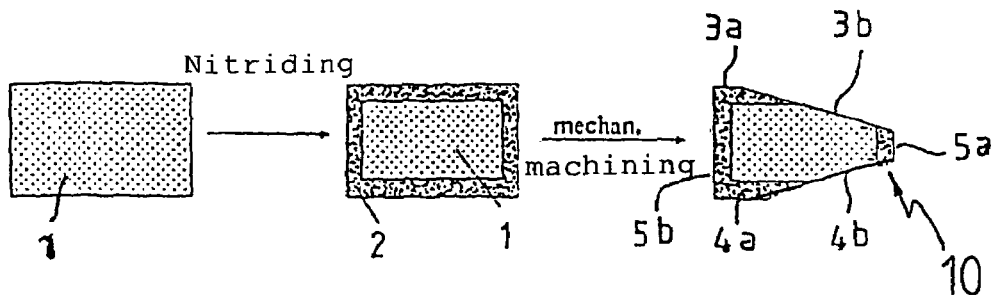
FIG. 1 a method for the production of keystone rings according to the state of the art.
Figure 2:
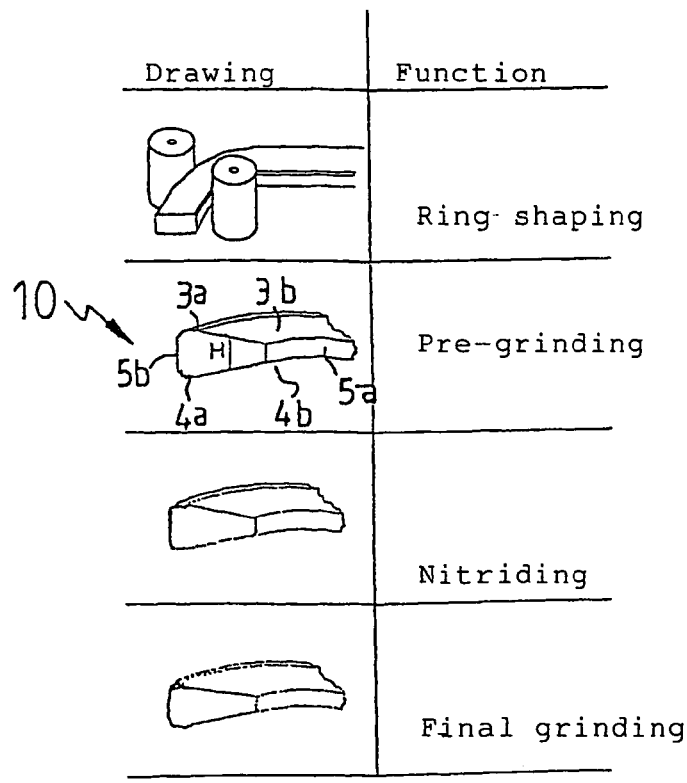
FIG. 2 a production method for keystone rings according to the invention.

A piston ring having an inner circumference surface 5a and an outer circumference surface 5b as well as an upper ring side 3a/b and a lower ring side 4a/b is first formed from a non-nitrided martensitic steel strip 1 having a rectangular cross-section, as shown in FIG. 1. The piston ring is subsequently thermally relaxed. After grinding machining of the ring butt sides and the outer circumference surface 5b, as well as brushing of the inner circumference surface 5a, parallel grinding of the upper 3a and lower 4a ring sides subsequently occurs, so that ring sides that are parallel to one another are formed. According to FIG. 2, the predetermined geometrical shape of a keystone ring 10 having slanted sides 3b, 4b, or a double keystone ring (not shown) is formed by means of the grinding of the upper and lower ring sides. In the region of its outer circumference surface, the parallel sides, by way of which the piston rings can be stacked, remain in a width that amounts to less than one-fourth of the piston ring width. After cleaning, the piston rings are surface-nitrided by means of a known gas nitriding process (GNS). The nitride layer consists of a diffusion layer and a connection layer, whereby the nitriding hardness depth in the diffusion layer can amount to as much as 200 μm. According to the invention, the connection layer possesses a hardness HV0.05 of 700 at a layer thickness of approximately 20 μm. The steel strip 1 has a chrome content between 12% to 17%, in order to form hard chrome nitrides. After final shaping, in which the nitrided piston ring is again subjected to a slight grinding or lapping process, without machining the sides, chrome or a chrome nitride layer can optionally be applied, preferably to the lower nitrided ring side, to further improve the wear properties, by means of a known PVD method (physical vapor deposition), since the greatest friction wear has been shown there, particularly in the case of keystone rings produced according to the state of the art according to FIG. 1.

Subsequently, a chrome nitride or manganese phosphate layer between 1-3 μm, at a hardness between 1200-1400 HV0.05, is applied to the outer circumference surface, which corresponds to the working surface of the piston ring, while avoiding any deposition onto the ring sides, by means of the PVD method, to further reduce the friction wear, whereby deposition of the chrome layer can also take place galvanically.

Nitriding of the piston rings takes place in the horizontally stacked but axially non-braced state, while PVD coating of the working surface takes place in the axially braced and stacked state. This guarantees that good nitriding of the sides is achieved, on the one hand, and that the sides are not coated with the wear protection layer to be applied during coating of the working surfaces, on the other hand.

After coating, the piston rings, particularly the nitrided ring sides, are finish-machined, by means of grinding off a maximum of one-fourth of the total nitride layer, whereby the connection layer (white layer) that forms during nitriding is removed.

Figure 3:
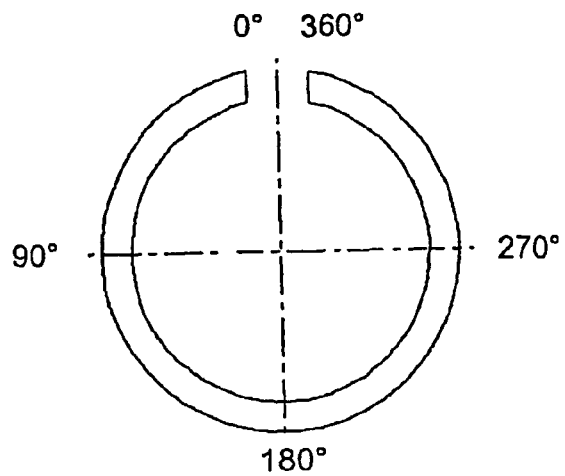
FIG. 3 a representation of the location-dependent ring side wear according to the state of the art and the method according to the invention.
Figure 3:
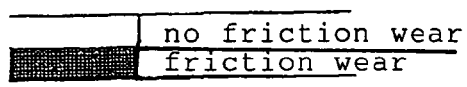
Figure 3:
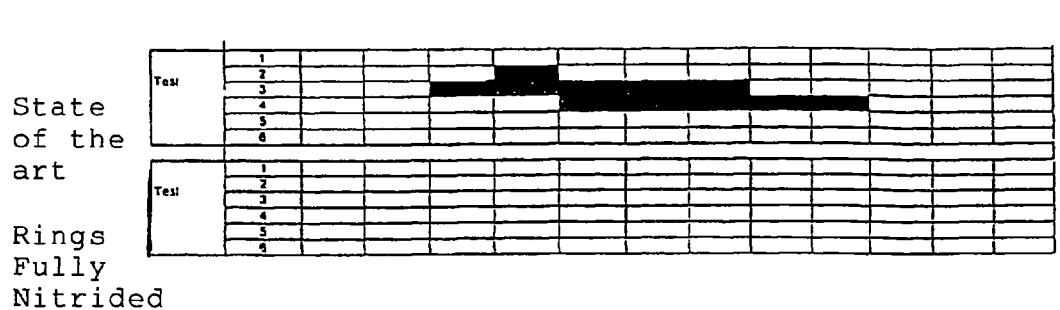

As can be seen from the representation of the local friction wear on the circumference side, according to FIG. 3, for a six-cylinder diesel engine with a running time of 100 h under full load, the method according to the invention results in a clear reduction in the friction wear at the ring sides, as compared with the state of the art.

REFERENCE SYMBOL LIST

10 keystone ring
1 steel strip; base material
2 nitride layer
3a upper ring side
3b upper parallel ring sides
4a lower ring side
4b lower parallel ring side
5a inner circumference surface
5b outer circumference surface; working surface.

The invention claimed is:

1. Method for the production of wear-resistant sides for a keystone ring for internal combustion engines, in which a rectangular ring is first formed, consisting of a steel strip having a rectangular cross-section as the base material, having an inner (5a) and an outer (5b) circumference surface as well as an upper and a lower side, which ring is subsequently nitrided on all sides by means of a nitriding process, and subsequently brought into its final shape and geometry by means of machining of the surfaces, whereby the base material is exposed at the ring sides (3a, 3b) by means of the machining, wherein shaping to form a piston ring having a rectangular cross-section is followed by the following method steps:

parallel grinding of the ring sides and grinding of the outer circumference surface to form its intended profile, and brushing of the inner circumference surface;

grinding of the upper and lower ring side (3a, 4a) to form the keystone ring, in such a manner that the piston ring still has parallel sides (3b, 4b) as a stacking surface in the region of its outer circumference surface;

complete nitriding of the piston ring surface by means of the gas nitriding process (GNS), to form a nitride layer;

shaping of the nitrided piston ring by means of grinding and lapping, without machining of the nitrided sides of the piston ring;

stacking of the piston rings by way of their parallel sides, under axial bias, to form a package, and coating of the outer circumference surface of the piston rings with a wear-resistant layer by means of PVD method(s);

grinding of the nitride layer of the sides in the de-stacked state, in such a manner that a maximum of one-fourth of the total layer thickness of the nitriding layer is removed.

2. Method according to claim 1, wherein the base material consists of a steel that contains 12 to 17% chrome.

3. Method according to claim 1, wherein a chrome layer is applied to the nitride layer of the lower side of the keystone ring, by means of the PVD method or galvanic method.

4. Method according to claim 1, wherein a chrome nitride layer or manganese phosphate layer is applied to the working surface as a wear layer.

5. Method according to claim 1, wherein the stacking surface takes up less than a fourth of the keystone ring width.

6. Method according to claim 1, wherein the base material consists of a martensitic non-nitrided steel strip.

* * * * *